(12) United States Patent
Xie et al.

(10) Patent No.: US 9,780,208 B1
(45) Date of Patent: Oct. 3, 2017

(54) METHOD AND STRUCTURE OF FORMING SELF-ALIGNED RMG GATE FOR VFET

(71) Applicant: GLOBALFOUNDRIES Inc., Grand Cayman, KY (US)

(72) Inventors: Ruilong Xie, Schenectady, NY (US); Chanro Park, Clifton Park, NY (US); Min Gyu Sung, Latham, NY (US); Hoon Kim, Halfmoon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/212,755

(22) Filed: Jul. 18, 2016

(51) Int. Cl.
| | |
|---|---|
| *H01L 29/51* | (2006.01) |
| *H01L 29/78* | (2006.01) |
| *H01L 29/66* | (2006.01) |
| *H01L 29/08* | (2006.01) |
| *H01L 21/324* | (2006.01) |
| *H01L 21/8234* | (2006.01) |
| *H01L 27/088* | (2006.01) |
| *H01L 29/49* | (2006.01) |
| *H01L 21/28* | (2006.01) |

(52) U.S. Cl.
CPC .... *H01L 29/7827* (2013.01); *H01L 21/28088* (2013.01); *H01L 21/324* (2013.01); *H01L 21/823418* (2013.01); *H01L 21/823437* (2013.01); *H01L 21/823487* (2013.01); *H01L 27/088* (2013.01); *H01L 29/0847* (2013.01); *H01L 29/4966* (2013.01); *H01L 29/517* (2013.01); *H01L 29/6656* (2013.01); *H01L 29/66545* (2013.01); *H01L 29/66666* (2013.01)

(58) Field of Classification Search
CPC ............. H01L 29/7827; H01L 29/6656; H01L 27/088; H01L 21/324; H01L 29/0847; H01L 29/66666; H01L 29/66545; H01L 29/4966; H01L 29/517; H01L 21/823487; H01L 21/28088; H01L 21/823418; H01L 21/823437
USPC ....................................................... 257/329
See application file for complete search history.

(56) References Cited

U.S. PATENT DOCUMENTS

| | | | | |
|---|---|---|---|---|
| 6,873,009 | B2* | 3/2005 | Hisamoto | G11C 11/404 257/316 |
| 2007/0111435 | A1* | 5/2007 | Kim | H01L 29/41791 438/253 |
| 2009/0159964 | A1* | 6/2009 | Lee | H01L 29/7827 257/329 |
| 2011/0140195 | A1* | 6/2011 | Zahurak | H01L 27/105 257/329 |
| 2012/0052640 | A1* | 3/2012 | Fischer | H01L 21/82342 438/268 |

* cited by examiner

*Primary Examiner* — Marc Armand
*Assistant Examiner* — Sue Tang
(74) *Attorney, Agent, or Firm* — Heslin Rothenberg Farley & Mesiti P.C.; Nathan B. Davis

(57) ABSTRACT

An intermediate semiconductor structure in fabrication includes a silicon semiconductor substrate, a hard mask of silicon nitride (SiN) over the substrate and a sacrificial layer of polysilicon or amorphous silicon over the hard mask. The sacrificial layer is patterned into sidewall spacers, each of the sidewall spacers having vertically tapered inner and outer sidewalls providing a rough triangular shape. The rough triangular sidewall spacers are used as a temporary hard mask to pattern the SiN hard mask.

19 Claims, 16 Drawing Sheets

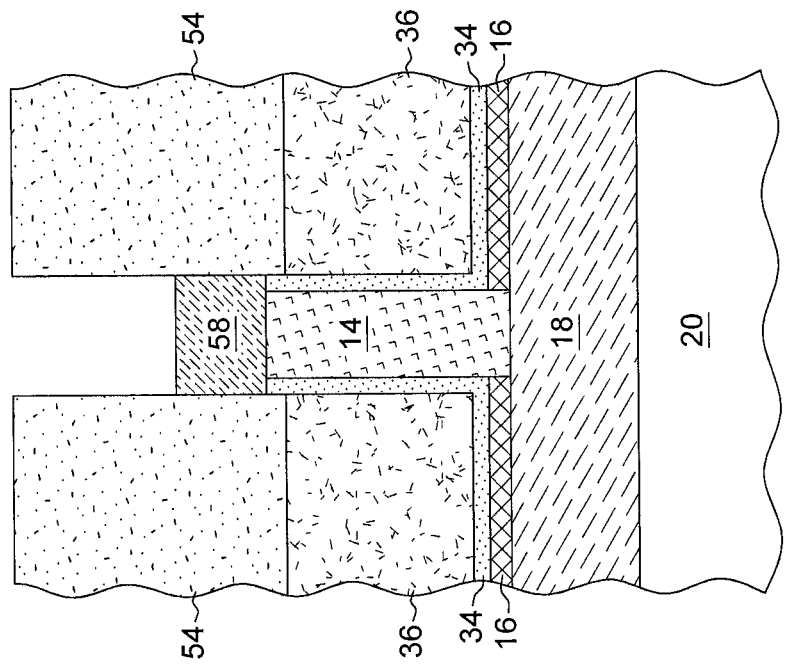
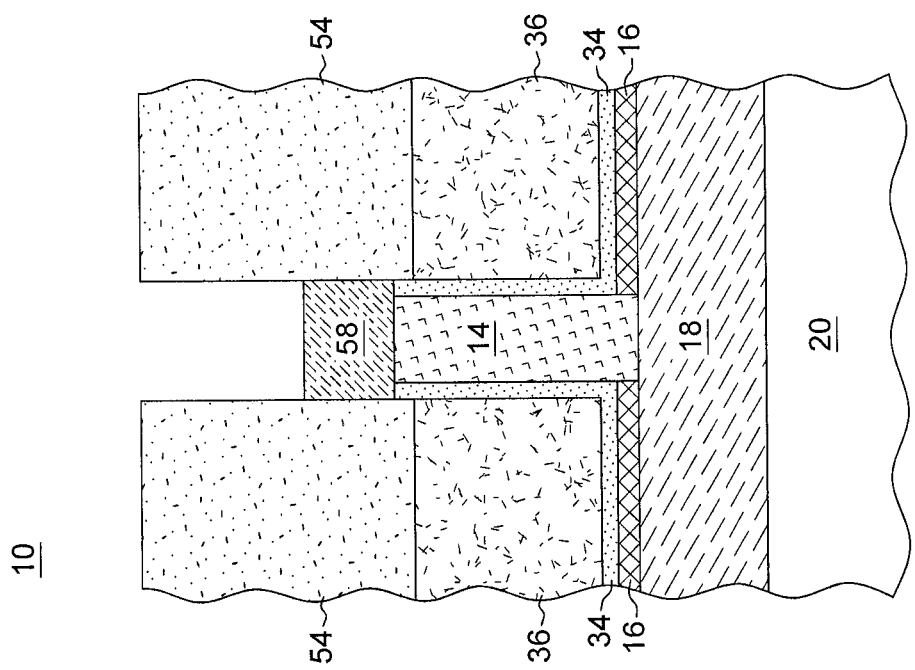
FIG. 6B
FIG. 6A

METHOD AND STRUCTURE OF FORMING SELF-ALIGNED RMG GATE FOR VFET

TECHNICAL FIELD

This invention relates to vertical field effect transistors (VFET) and more particularly to forming self-aligned replacement metal gates therefor.

BACKGROUND INFORMATION

Currently, the fabrication of VFETs utilize a gate first fabrication technique. Gate first fabrication techniques refer to a situation where the gate is patterned prior to the annealing step used to activate the source and drain. However, in gate last techniques, a dummy gate is used to occupy the gate space during the annealing process and a replacement metal gate is inserted into the dummy gate area after the anneal. The gate last technique and the use of replacement metal gates avoids the difficult thermal issues normally encountered with use of the gate first technique.

Accordingly, it is desirable to provide a self-aligned replacement metal gate method and structure for forming self-aligned replacement metal gates for vertical field effect transistors to provide desired thermal characteristics and effective area scaling.

SUMMARY OF THE INVENTION

In accordance with one aspect of the invention, a method of providing a fin structure is disclosed. The fin structure includes a fin with sacrificial material above and adjacent the fin, with the fin structure being above a substrate adjacent a source or drain. The method includes removing a first portion of the sacrificial material above the fin to form an opening within the sacrificial material on top of the fin, forming a top source or drain within the opening on top of the fin, removing a second portion of the sacrificial material adjacent the top source or drain, depositing a spacer above and adjacent the top source or drain, depositing a gate material above the spacer and below the spacer to the sides of the fin, and removing the gate material above the bottom portion of the spacer to form a self aligned gate around the fin and a vertical field effect transistor.

The sacrificial material includes a first sacrificial material. A top portion of the first sacrificial material located above and adjacent said fin structure is removed to allow a remaining portion of the first sacrificial material to remain adjacent said fin. A second sacrificial material may be deposited above the remaining first sacrificial material so that the sacrificial material includes a first sacrificial material, the second sacrificial material, and a hard mask on the top of the fin.

The first sacrificial material may be a thin oxide surrounding the fin structure and an amorphous silicon deposited on top of the thin oxide. The second sacrificial material may be an oxide. The removing of a first portion of the sacrificial material above the fin to form an opening within the sacrificial material on top of the fin may include removing the hard mask above or on top of said fin. The self-aligned contact (SAC) cap may be deposited above the top source or drain within the oxide. The method may also include removing the oxide prior to depositing a spacer above and adjacent the top source or drain. Also, removing a third portion of the sacrificial material adjacent the fin may include removing the amorphous silicon.

The method may further include removing the thin oxide, which may be a silicon oxide. The method may also include providing a bottom spacer above the source or drain and substrate adjacent the fin. And, may include depositing a high K dielectric material on the bottom spacer, where the spacer and the fin form an intermediate structure, and annealing the intermediate structure.

The method may also include depositing a work function metal as part of the gate material and a metal over the work function metal as part of the gate material.

Removing the gate material above the bottom portion of the spacer may include removing the work function metal and the metal.

The method may further include removing annealed high K material above the spacer above and adjacent the top source or drain, depositing a second lithography stack over the barrier stack, performing a second lithography to pattern the at least one via opening, and etching to form at least one via opening.

The method may also include providing multiple fin structures, multiple top sources or drains to form multiple vertical field effect transistors. The fin structures may be parallel spaced with at least two vertical field effect transistors spaced apart and aligned along lengths thereof and forming at least one additional gate connecting aligned on parallel spaced vertical field effect transistors.

In another aspect of the invention, the method includes providing a fin structure having a fin with a hard mask on top of the fin. The fin structure is above a substrate adjacent a source or drain. The method includes depositing one or more sacrificial materials above and along sides of the fin structure, removing a top portion of the one or more sacrificial materials above a top of the fin to form an opening within the one or more sacrificial materials, forming a top source or drain within the opening on the top of said fin, removing a portion of the one or more sacrificial materials above and adjacent the top source or drain, depositing a spacer above the top source or drain, removing additional portions of the one or more sacrificial materials surrounding sides of the fin, depositing gate material above the spacer and below the spacer to the sides of the fin, and removing the gate material above the bottom portion of the spacer to form a self aligned gate around the fin and vertical field effort transistor.

In another aspect of the invention, the invention includes an intermediate semiconductor structure having a fin structure. The fin structure includes a fin above a substrate adjacent a bottom source or drain, a top source or drain located on the top of the fin, a spacer located above and surrounding the top source or drain and adjacent a top portion of the fin, a self-aligned gate structure located below the top spacer and above a bottom spacer located above said substrate and source or drain, and one or more work function layers located between the bottom spacer and side walls of the fin and top spacer.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 6A depicts a cross sectional view of the structure of FIG. 5A after removal of the exposed hardmask material, and formation of an upper source drain junction;

FIG. 6B depicts a cross sectional view of the structure of FIG. 5B after removal of the exposed hardmask material, and deposition of an upper source drain junction;

DETAILED DESCRIPTION OF THE INVENTION

Figure 1B:
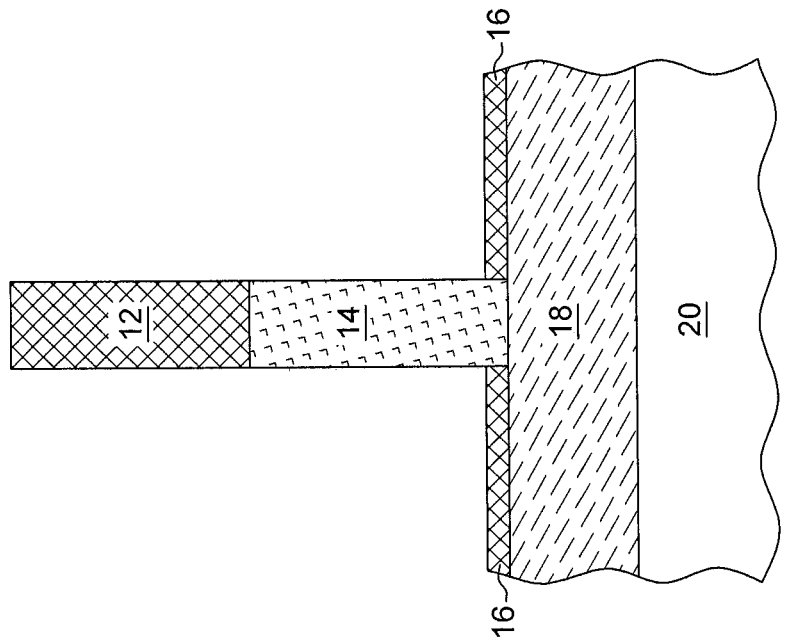
FIG. 1B depicts a cross sectional view of a fin of a positive channel field-effect transistor device (pFET) including hardmask material which may be situated above and or included adjacent as a bottom to the fin and can include a bottom source drain region and insulator region.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including")", and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Reference is made below to the drawings, which are not drawn to scale for ease of understanding, wherein the same reference numbers are used throughout different figures designate the same or similar components.

In accordance with one aspect of this invention, the following describes a method for manufacturing a fin structure, wherein this fin structure includes a fin with a sacrificial material above and/or adjacent to the fin. The fin structure also being above a substrate while being adjacent to a source or drain. The figures referenced are numbered and are labeled (A) and (B) to show the corresponding method for a negative channel field-effect transistor on the figures labeled with (A) and the corresponding method for a positive channel field-effect transistor on the figures labeled with (B).

Figure 1A:
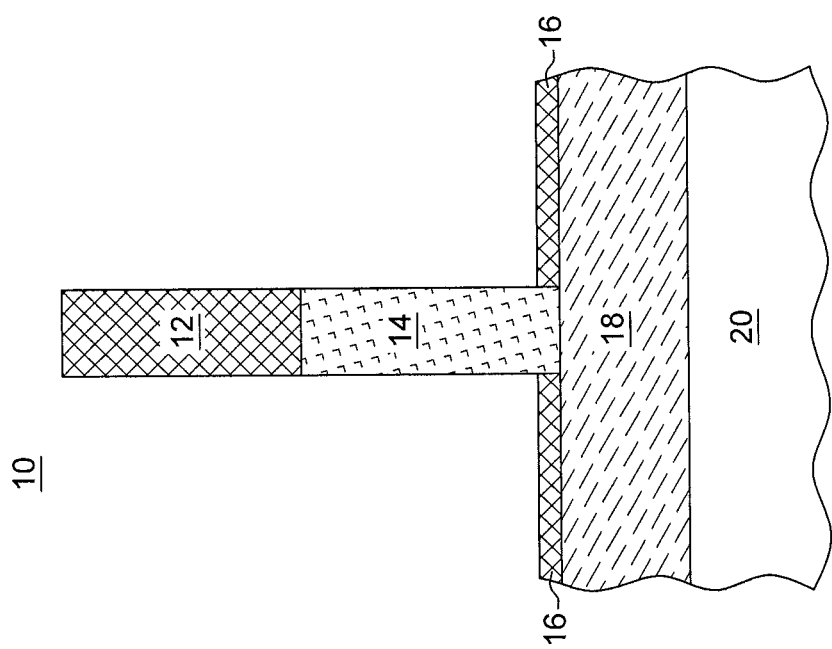
FIG. 1A depicts a cross sectional view of a fin of negative channel field-effect transistor device (nFET) including hardmask material which may be situated above and or included adjacent as a bottom spacer to the fin and can include a bottom source drain region and insulator region.

Referring to FIG. 1A, a n-type vertical FIN field-effect-transistor (n-VFINFET) is initially fabricated in a conventional manner. The structure includes hardmask material 12 which is situated above the vertical FIN channel, and a bottom spacer 16, to a fin 14 and can include a bottom source/drain region 18 and a substrate 20. There may also be an isolation region (not shown) between adjacent devices 10 if more than one device is fabricated. Referring to FIG. 1B a structure of a p-type VFINFET is fabricated in a conventional manner. The structure includes a hardmask material 12, including but not limited to a nitride such as silicon nitride, which may be situated above and/or included adjacent a bottom spacer 16 (typically a nitride material) to a fin 14 and can include a bottom source/drain region 18 and an insulator region 20. The n-VFINFET and p-VFINFET regions may be located on the same semiconductor wafer, for example in different, yet adjacent areas of a wafer separated by any distance that will not interfere with the operation of a VFET device. The fin 14 may include semiconductor materials, including but not limited to silicon, silicon germanium, and any III-V type materials. The bottom source/drain region 18 may include silicon, silicon germanium, or any other semiconductor material, and may be doped, often at high concentrations. The doping will vary for the device, but for an NFET it may be phosphorous doped and for a PFET it may be boron doped. Additionally, the source/drain region 18 in FIG. 1A may be different from the source/drain region 18 of FIG. 1B, and both may be doped differently. The substrate region 20 can include silicon, silicon germanium, and any III-V type materials Referring to FIG. 2A, a first sacrificial material 34 and a second sacrificial material 36 are deposited onto the structure shown in FIG. 1A. The first sacrificial material 34 may be in the form of a thin oxide deposed on and surrounding the hardmask material 12 above the bottom spacer 16, the fin 14 and the bottom spacer 16 itself. The second sacrificial material 36 may be an amorphous silicon layer and may be deposited over and surrounding the first sacrificial material 34. Referring to FIG. 2B, the first sacrificial material 34 and second sacrificial material 36 are deposited onto the structure shown in FIG. 1A. The first sacrificial material 34 may be a thin oxide deposed on and surrounding the hardmask material 12 above the bottom spacer 16, the fin 14 and the bottom spacer 16 itself. The second sacrificial material 36 which may be an amorphous silicon layer may be deposited over and surrounding said first sacrificial material 34. First and Second sacrificial material 34 and 36 may be deposited, for instance, by atomic layer deposition (ALD), physical vapor deposition (PVD), or any other chemical vapor depositions (CVD) capable of applying thin films consistently.

Figure 2A:
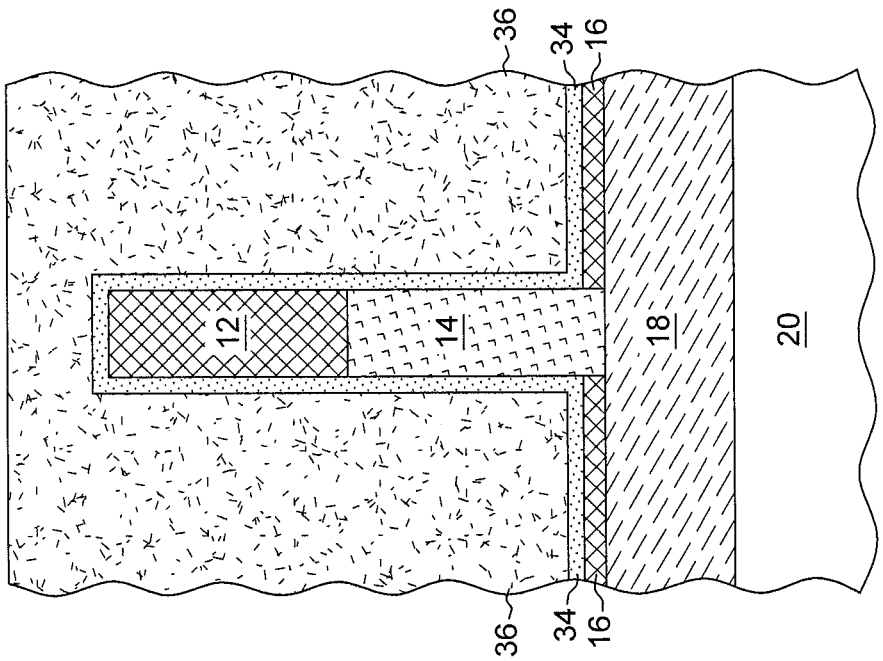
FIG. 2A depicts a cross sectional view of the structure of FIG. 1A after application of a first sacrificial material which may be in the form of a thin oxide surrounding said fin structure, and a second sacrificial material which may be in the form of an amorphous silicon layer deposed upon the first sacrificial material.
Figure 2B:
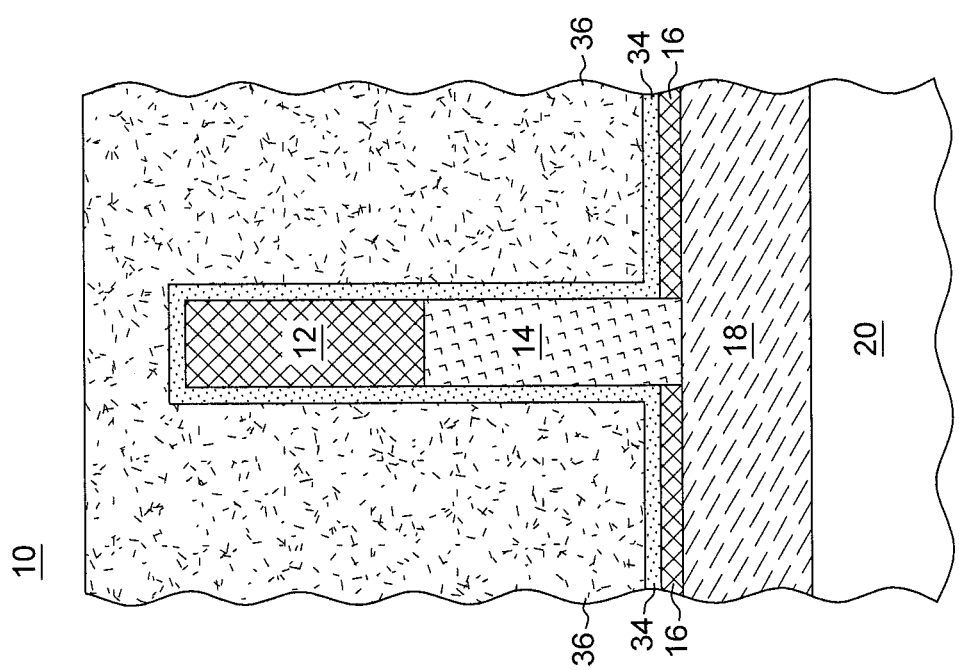
FIG. 2B depicts a cross sectional view of the structure of FIG. 1B after application of a first sacrificial material which may be in the form of a thin oxide surrounding said fin structure, and a second sacrificial material which may be in the form of an amorphous silicon layer deposed upon the first sacrificial material.
Figure 3B:
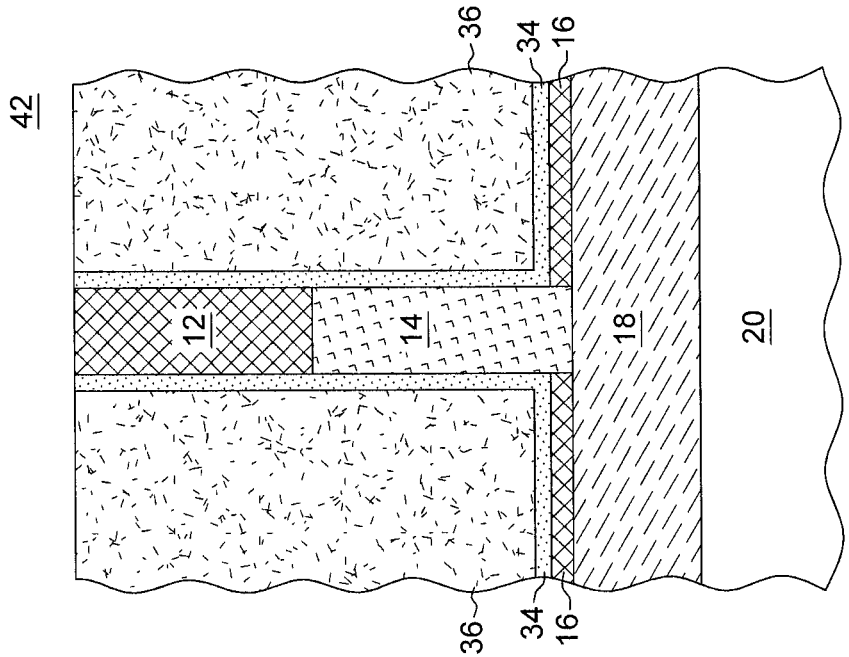
FIG. 3B depicts a cross sectional view of the structure of FIG. 2B after removing of a first portion of the first sacrificial material a first portion of the second sacrificial material thereby exposing the hardmask material located above the fin.
Figure 3A:
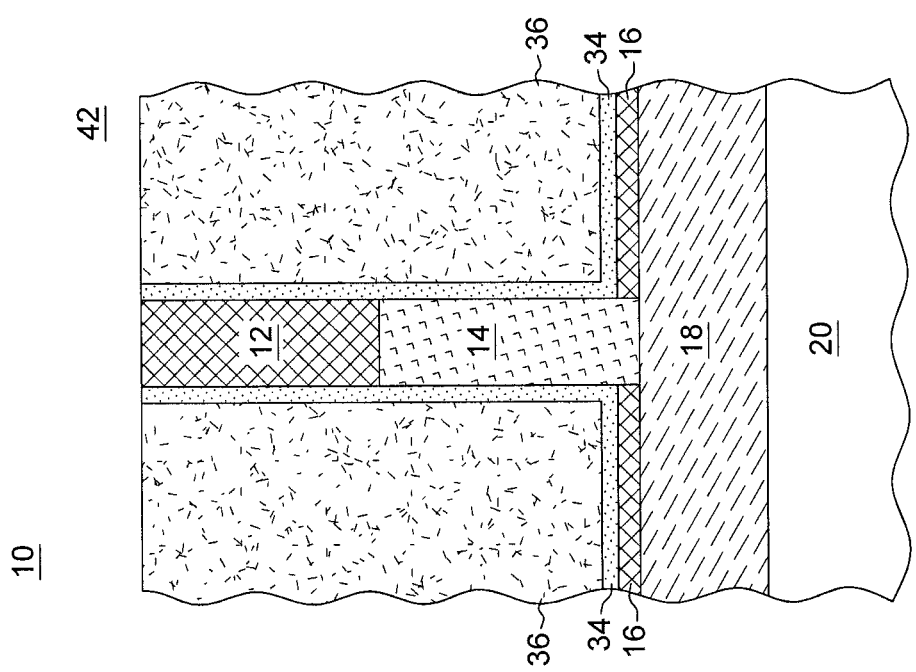
FIG. 3A depicts a cross sectional view of the structure of FIG. 2A after removing of a first portion of the first sacrificial material a first portion of the second sacrificial material thereby exposing the hardmask material located above the fin.

Referring to FIG. 3A, the structure of FIG. 2A is planarized by, for example, a chemical mechanical polishing (CMP) technique. During planarization, the first sacrificial material 34 and the second sacrificial material 36 is removed from a first portion 42, i.e., the top of device 10, exposing the top section of the hardmask material 12. Then, as shown in FIG. 4A, a portion of the second sacrificial material 36, adjacent to hardmask 12 and a top portion of fin 14, is removed by, for example, etching using any wet or dry etch techniques to recess the second sacrificial material 36 below a top surface of device 10.

Figure 4B:
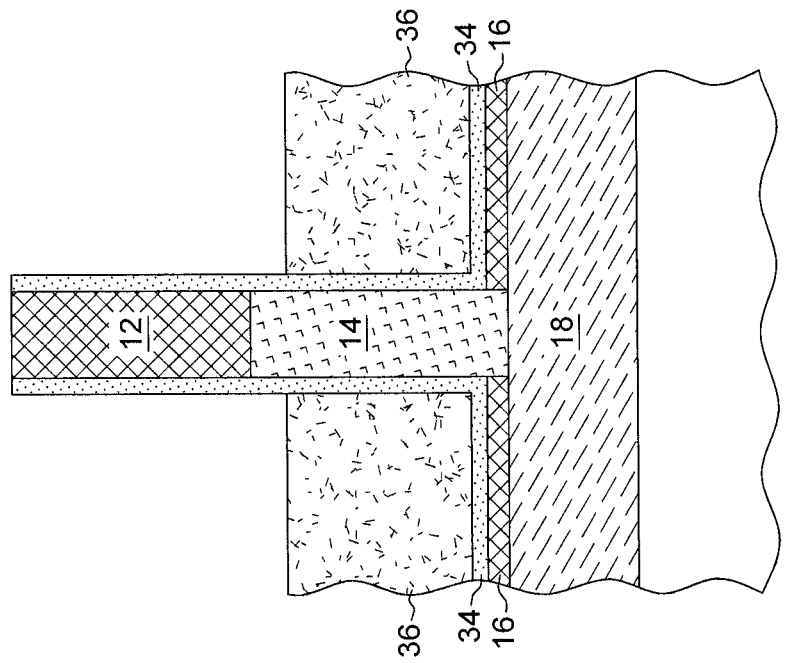
FIG. 4B depicts a cross sectional view of the structure of FIG. 3B after the recessing of a second portion of the first sacrificial further exposing the second sacrificial material.

FIG. 3B illustrates the planarization of the structure of FIG. 2B by, for example, CMP. During planarization, as described in reference to FIG. 3A, the first and second sacrificial material 34 and 36 is removed from a first portion 42. Then as shown in FIG. 4B, a portion of the second sacrificial material 36, adjacent to hardmask 12 and a top portion of fin 14, is removed by, for example, etching using any wet or dry etch techniques to recess the second sacrificial material 36 below a top surface of device 10.

Figure 4A:
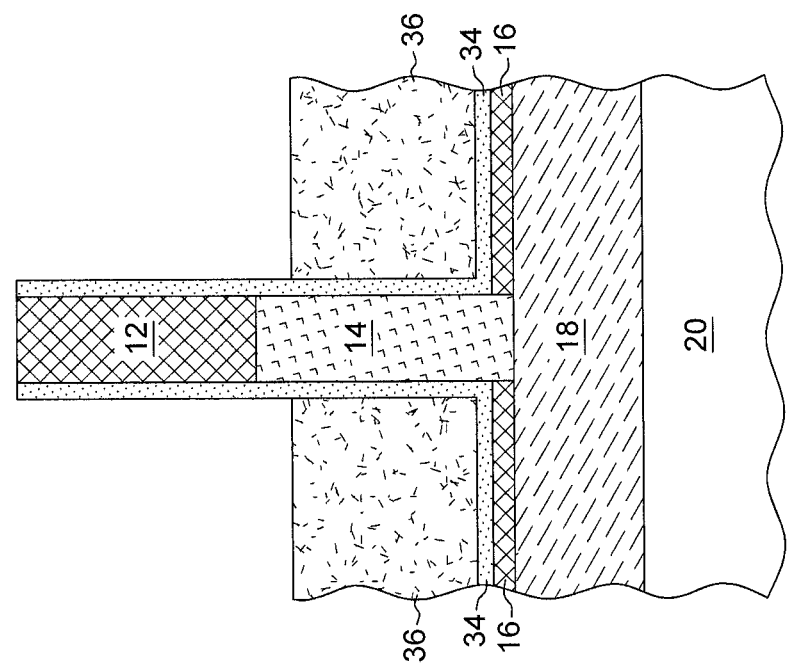
FIG. 4A depicts a cross sectional view of the structure of FIG. 3A after the recessing of a second portion of the first sacrificial further exposing the second sacrificial material.
Figure 5B:
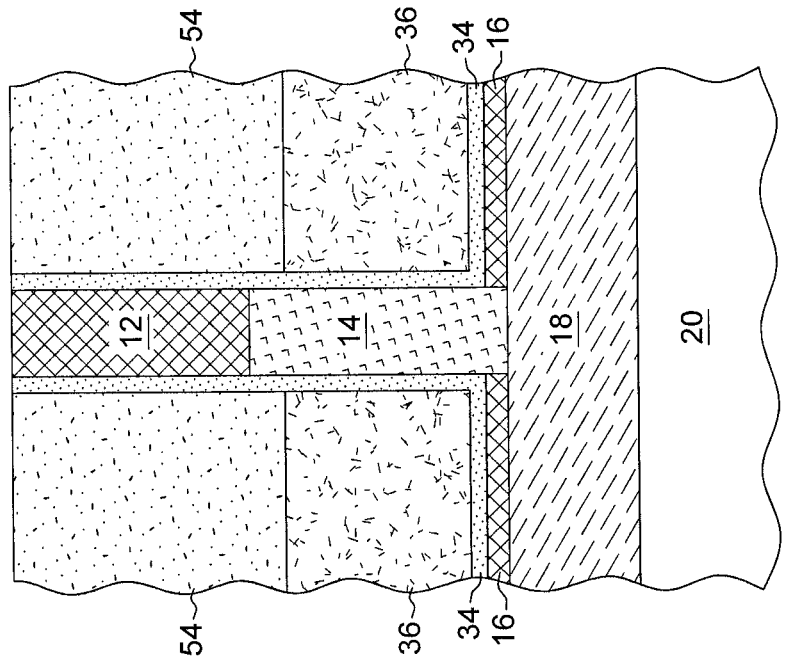
FIG. 5B depicts a cross sectional view of the structure of FIG. 4B after application of a third sacrificial material which may include an oxide.
Figure 5A:
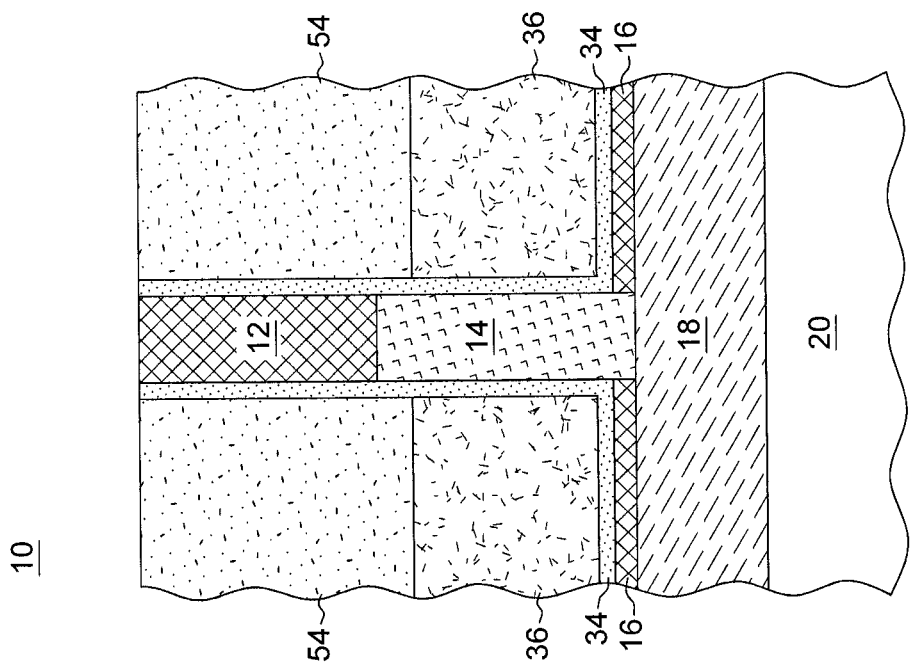
FIG. 5A depicts a cross sectional view of the structure of FIG. 4A after application of a third sacrificial material which may include an oxide.

Referring to FIG. 5A, a third sacrificial material 54, which may include an oxide material, is deposited by ALD, CVD, or PVD in some embodiments, in the region shown in FIG. 4A which has been etched to recess the second sacrificial material 36. Referring to FIG. 5B, third sacrificial material 54 is similarly deposited on the positive channel.

Figure 7A:
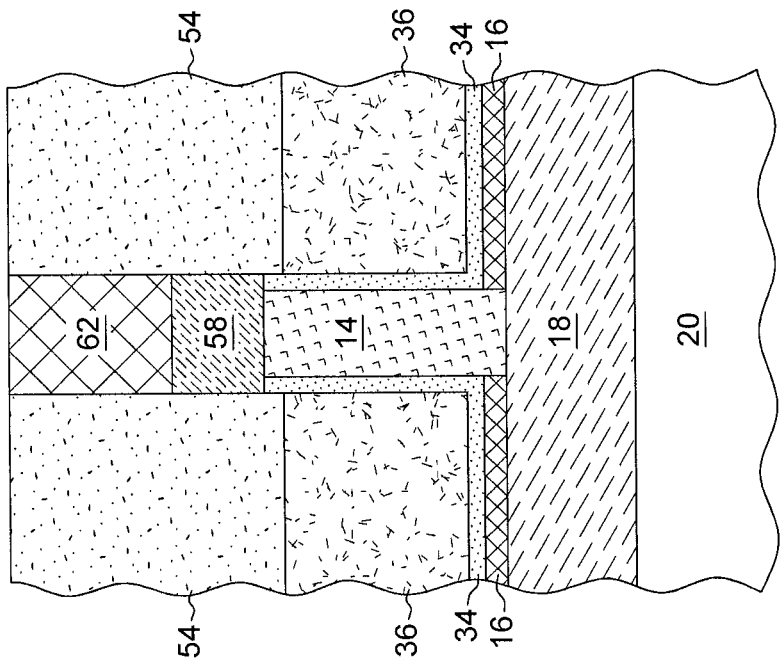
FIG. 7A depicts a cross sectional view of the structure of FIG. 6A after application of a cap, which may be composed of a self aligned contact nitride above the upper source drain junction.
Figure 7B:
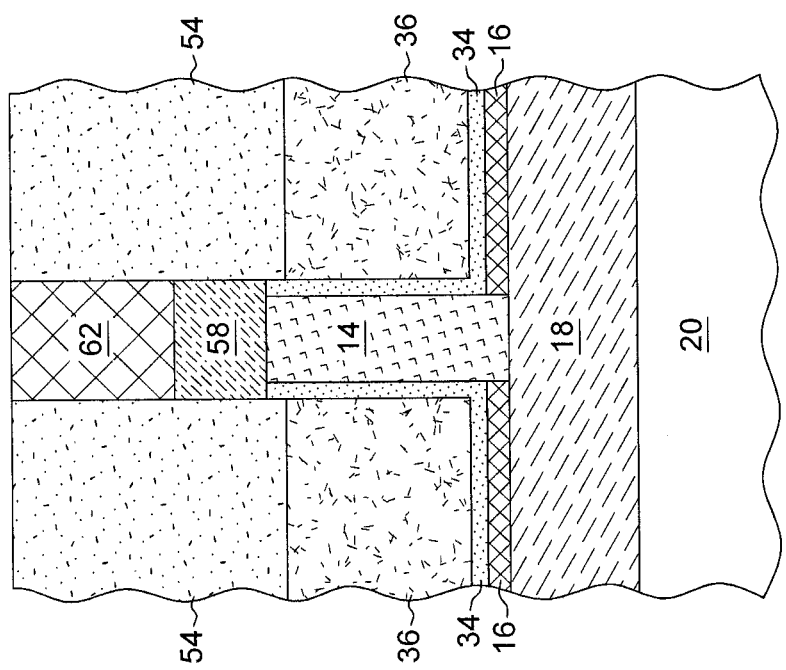
FIG. 7B depicts a cross sectional view of the structure of FIG. 6B after application of a cap, which may be composed of a self aligned contact nitride above the upper source drain junction.

Referring to FIG. 6A, the remaining hardmask material 12 is removed by selective etching processes to expose the fin 14. This can include any etch that is selective for a nitride material, and may include plasma etching. In its place, an upper source-drain 58 can be formed by selective epitaxy process, including but not limited to silicon and silicon germanium. The material and doping of upper source-drain 58 may be a different material for the n-VFINFET and p-VFINFET of FIGS. 6A and 6B. For instance, the n-VFINFET (FIG. 6A) may include a heavily phosphorus doped silicon material, and the p-VFINFET (FIG. 6B) may be a heavily boron doped SiGe material. The patterning processes to form separate top S/D materials are not shown in detail here, because it is not the main focus of this disclosure. As shown in FIG. 7A, a cap 62 is placed above the upper source-drain junction 58. The cap 62 may be composed of a nitride, which will assist in subsequent self-aligned contact (SAC) etching to mask the upper source/drain junction 58 below. Similarly, referring to FIG. 6B, the hardmask material 12 is removed on the p-VFINFET area by selective etching, to expose the fin 14. In its place an upper source-drain junction 58 can be formed. As shown in FIG. 7B, the nitride SAC cap 62 is also deposited above the upper source-drain junction 58 of the pFET region.

Figure 8B:
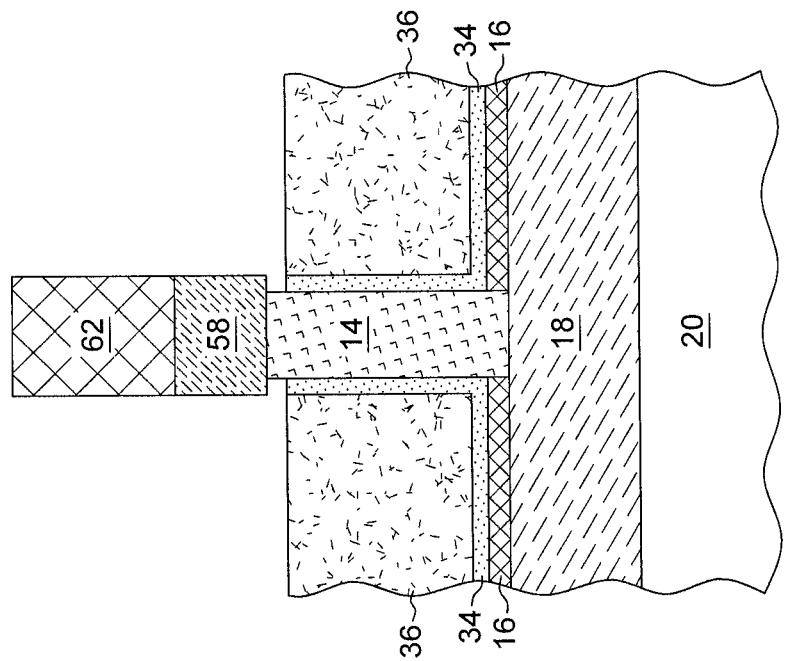
FIG. 8B depicts a cross sectional view of the structure of FIG. 7B after removal of the third sacrificial material.
Figure 8A:
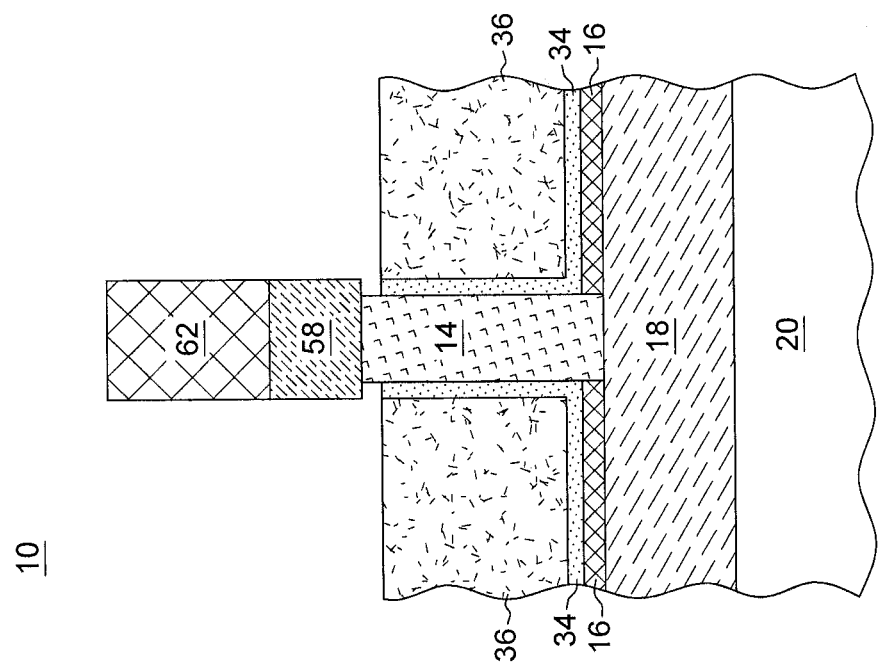
FIG. 8A depicts a cross sectional view of the structure of FIG. 7A after removal of the third sacrificial material.
Figure 9A:
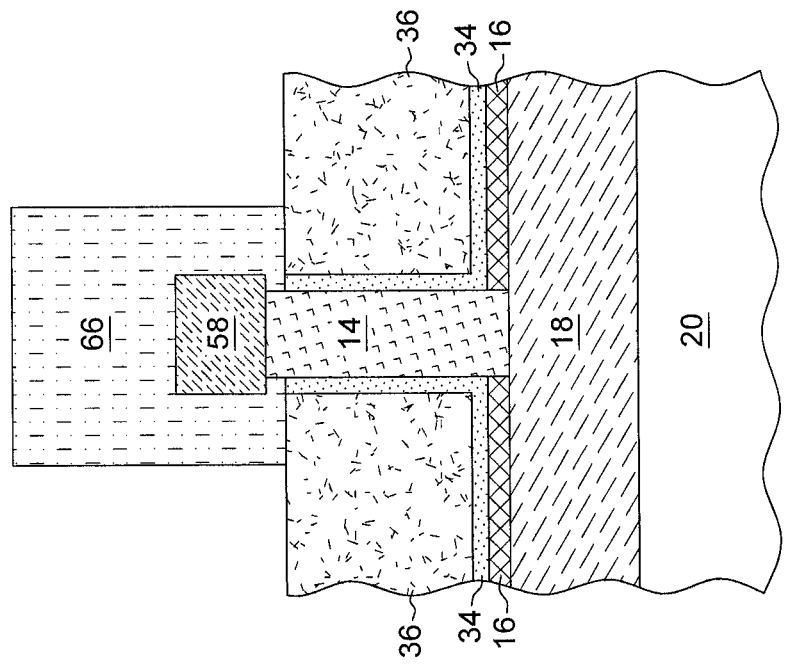
FIG. 9A depicts a cross sectional view of the structure of FIG. 8A after adding a top spacer by means which may include deposition consisting of a material that may include SiN.
Figure 9B:
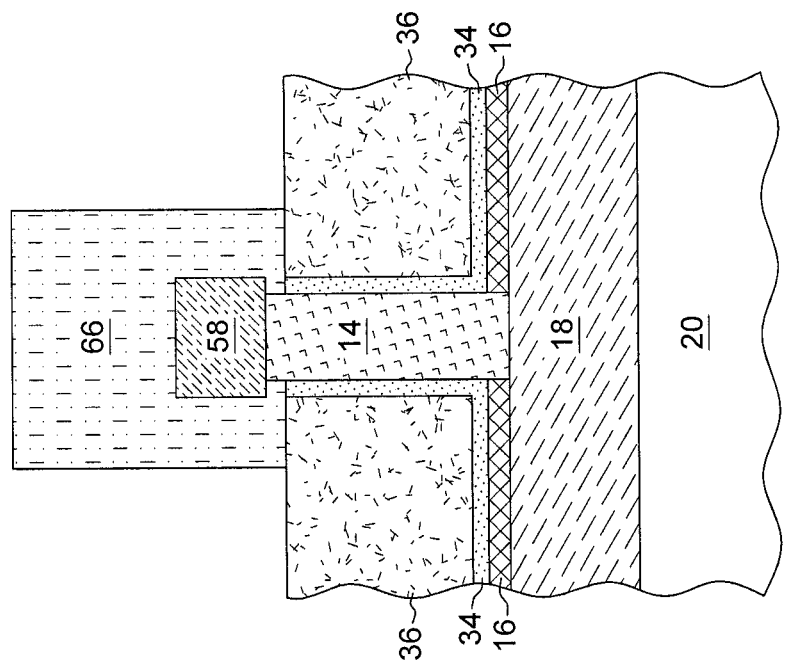
FIG. 9B depicts a cross sectional view of the structure of FIG. 8B after adding a top spacer by means which may include deposition consisting of a material that may include SiN.

Referring to FIG. 8A, what remains of the third sacrificial material 54 is removed, for instance, by buffered hydrofluoric acid (BHF) oxide etch, from the structure of FIG. 7A. This may also remove the exposed portion of the first sacrificial material 34 below upper source/drain junction 58 and above the second sacrificial material 36. Then, depicted in FIG. 9A, a spacer 66 may be deposited adjacent the nitride cap 62 and around exposed source/drain region 58. Spacer 66 can be of the same material as nitride cap 62, and thus is shown as a single feature. Deposition can include any of CVD, PVD, and ALD. The Spacer 66 may then be etched back, if necessary, so as not to cover the entirety of the second sacrificial material 36. The spacer 66 is deposited over and surrounding the upper source-drain junction 58. Similarly, referring to FIG. 8B, the third sacrificial material 54 may be removed from the pFET regions as well as described above. Thereafter, as shown in FIG. 9B, spacer 66 is deposited adjacent the pFET nitride cap 62 and upper source-drain region 58, creating a single spacer 66 merging with the nitride cap 62.

Figure 10B:
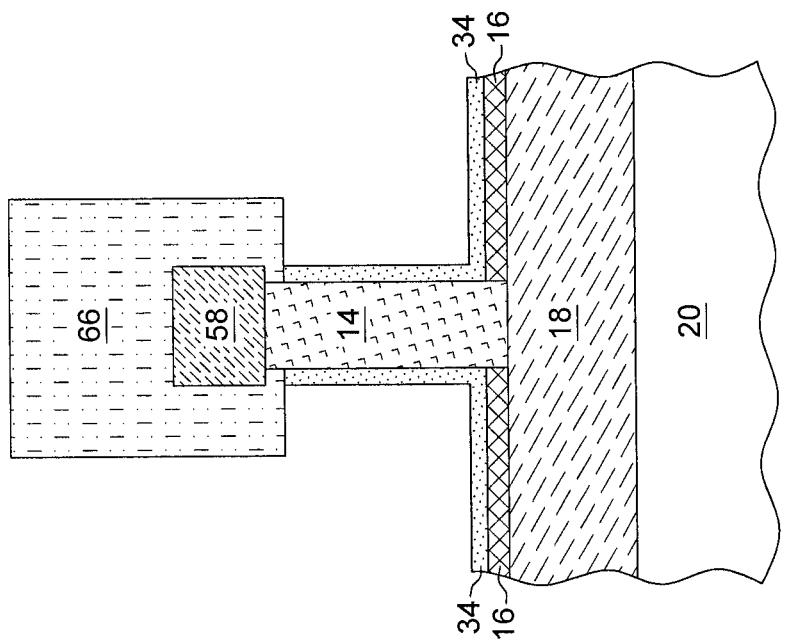
FIG. 10B depicts a cross sectional view of the structure of FIG. 9B after removal of the second sacrificial material.
Figure 10A:
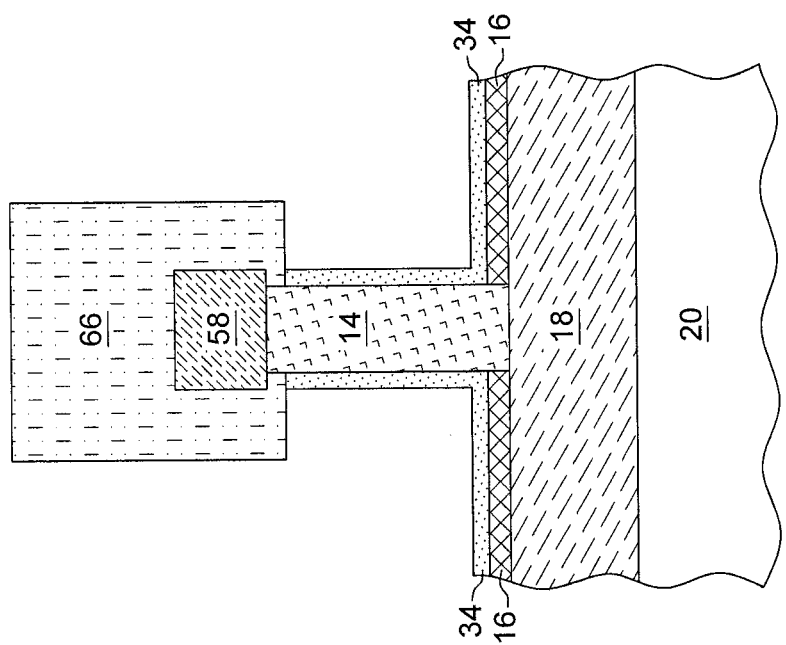
FIG. 10A depicts a cross sectional view of the structure of FIG. 9A after removal of the second sacrificial material.
Figure 11B:
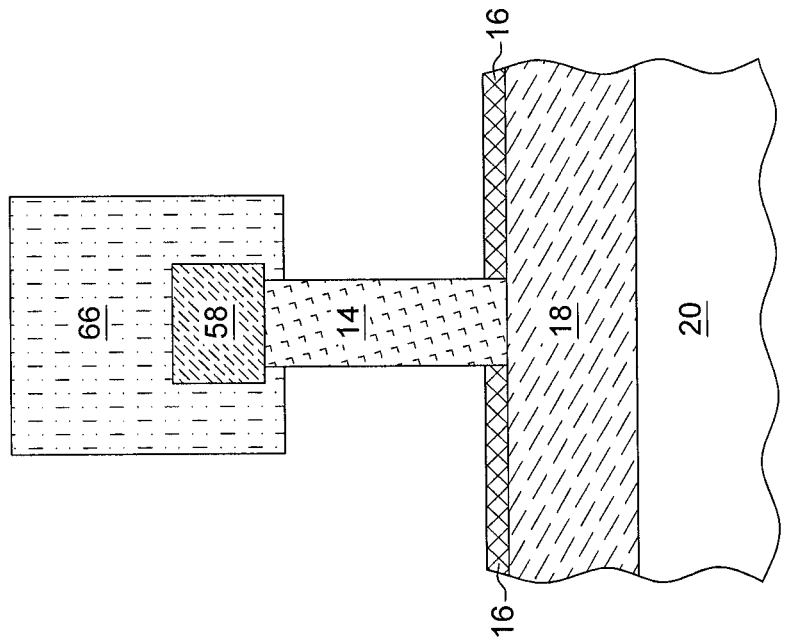
FIG. 11B depicts a cross sectional view of the structure of FIG. 10B after removal of the first sacrificial material.
Figure 11A:
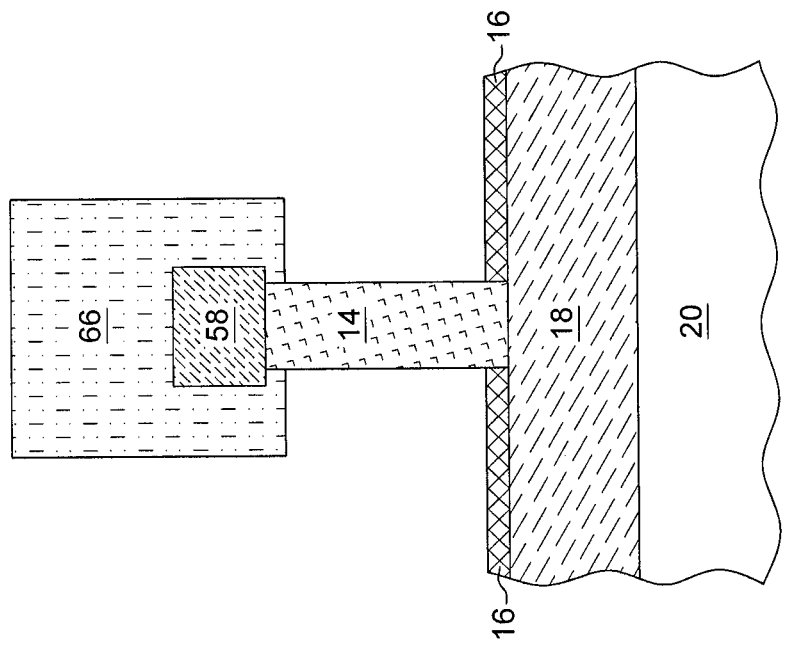
FIG. 11A depicts a cross sectional view of the structure of FIG. 10A after removal of the first sacrificial material.

Referring to FIGS. 10A and 10B, the second sacrificial material 36 may then be removed by wet etching, such as hot ammonia or tetra methyl ammonia hydroxide (TMAH). Then, as shown in FIGS. 11A and 11B, the first sacrificial material 34 may then be removed by, for example, selective oxide etching or any other suitable techniques such as wet dilute hydrofluoric (DHF) etching, or dry chemical oxide removal (COR) process.

Figure 12A:
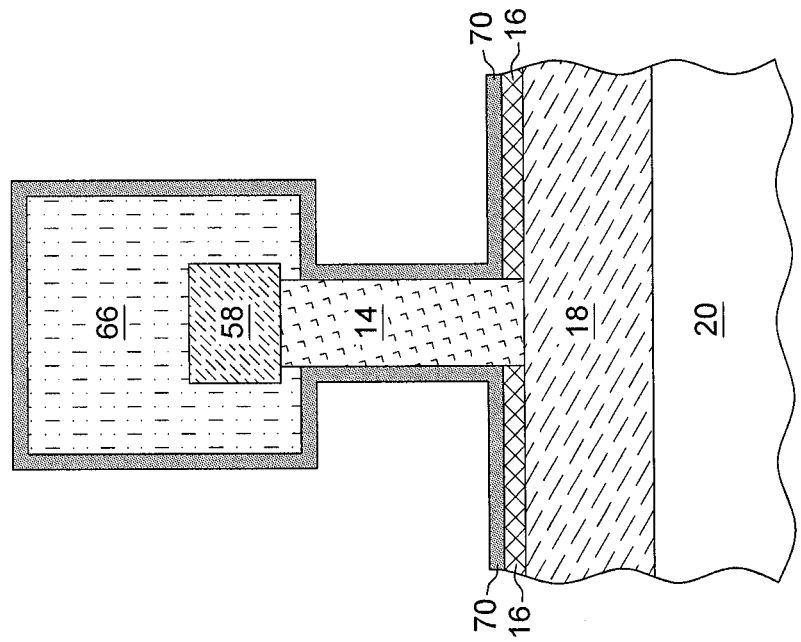
FIG. 12A depicts a cross sectional view of the structure of FIG. 11A after application of a material layer through means such as chemical deposition wherein the material contains the property of having a high dielectric constant.
Figure 12B:
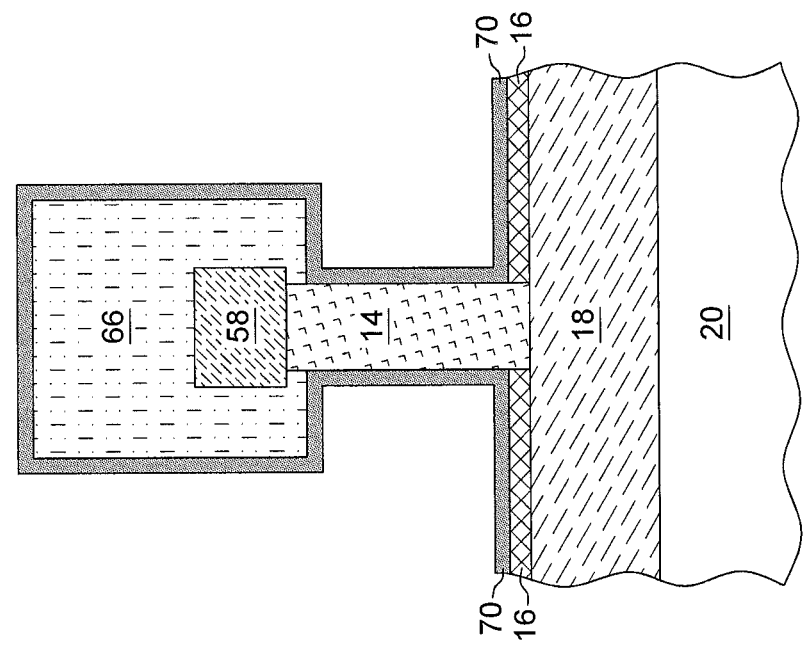
FIG. 12B depicts a cross sectional view of the structure of FIG. 11B after application of a material layer through means such as chemical deposition wherein the material contains the property of having a high dielectric constant.
Figure 13B:
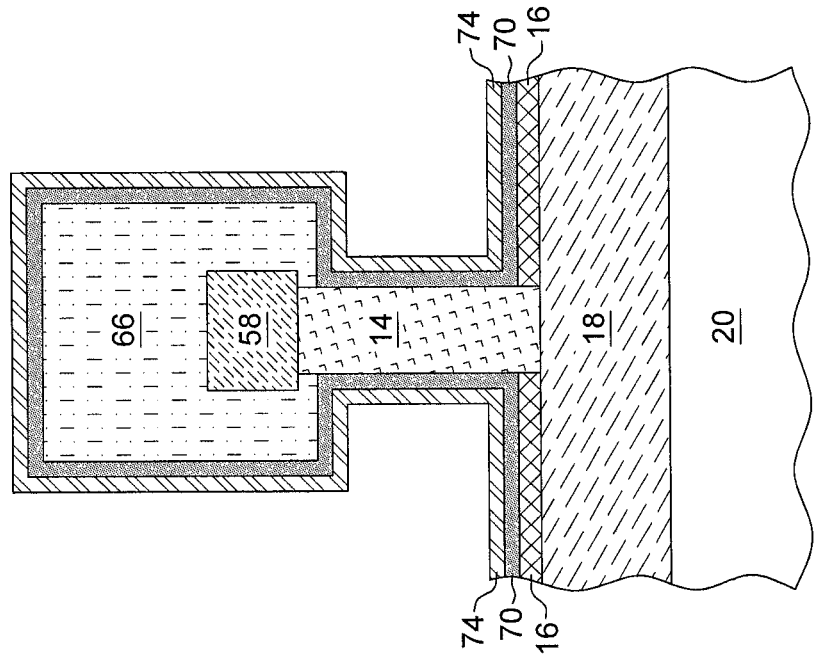
FIG. 13B depicts a cross sectional view of the structure of FIG. 12B after deposition of a work function metal layer.
Figure 13A:
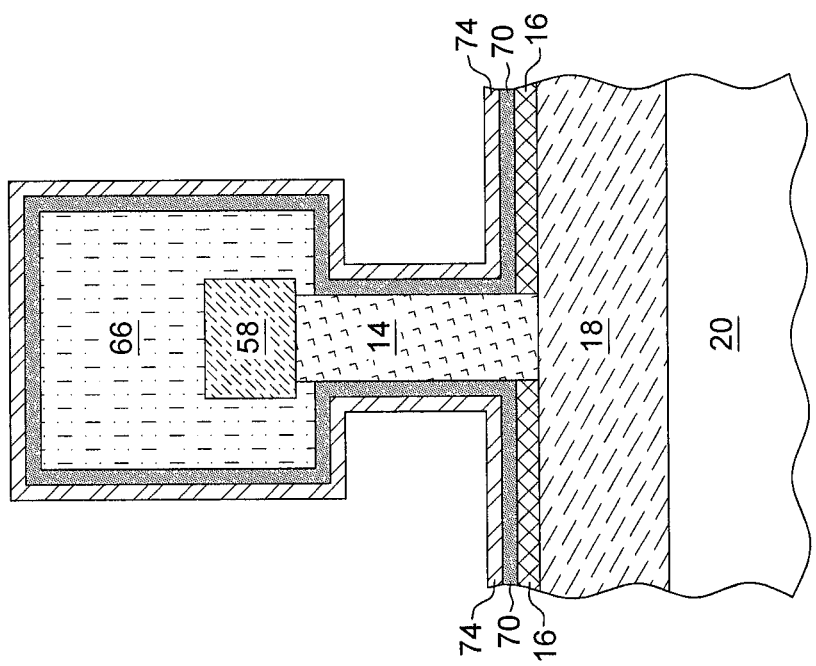
FIG. 13A depicts a cross sectional view of the structure of FIG. 12A after deposition of a work function metal layer.
Figure 14B:
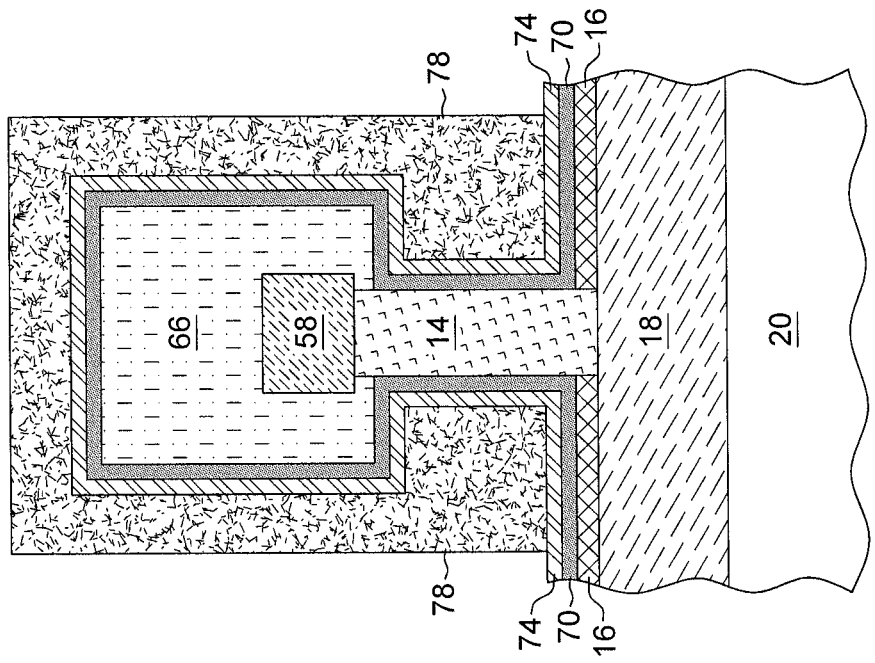
FIG. 14B depicts a cross sectional view of the structure of FIG. 13B after deposition of a gate metal.
Figure 14A:
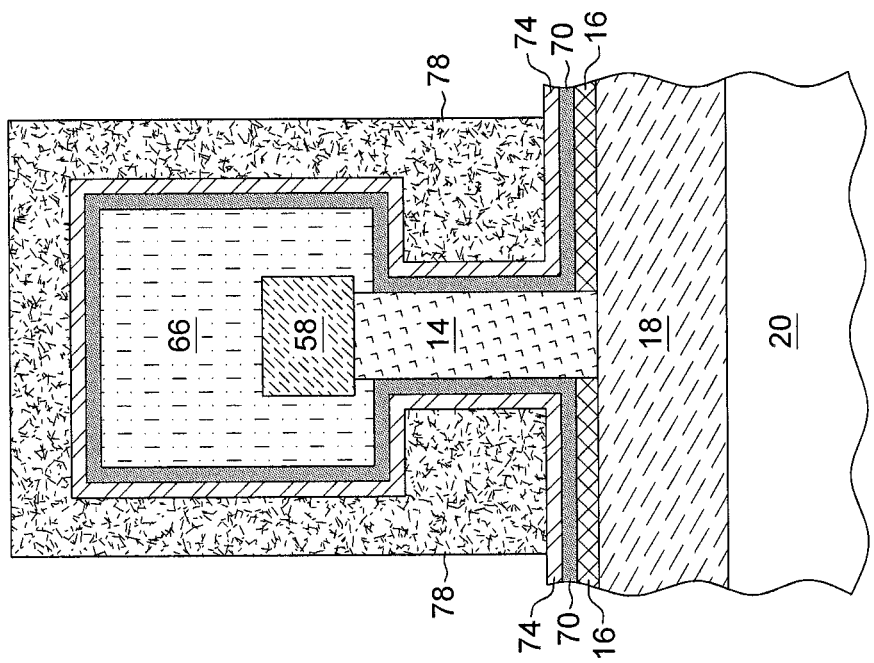
FIG. 14A depicts a cross sectional view of the structure of FIG. 13A after deposition of a gate metal.

Referring to FIGS. 12A and 12B, a high K dielectric material is conformally deposited over the spacers 66, the fin 14 and the bottom spacer 16 on both the n-VFINFET and p-VFINFET regions. The high K dielectric can include $HfO_2$, $ZrO_2$, $Al_2O_3$, $TiO_2$, $Ta_2O_5$, lanthanide oxides and mixtures thereof, silicates and materials such as YSZ (yttria-stabilized zirconia), BST, BT, ST, and SBT. Then, as shown in FIGS. 13A and 13B, a work function metal (WFM) layer 74 is conformally deposited over the high K layer and remaining structure. The WFM layer 74 can include a single-element metal, for instance cobalt, titanium, aluminum, or other metals alloys that will allow proper workfunction to give desired threshold voltage (Vt), such as TiN, TaN, TiC, TiAl, etc, and may be deposited, for instance, using ALD. Additionally, the WFM layer 74 for n-VFINFET and p-VFINFET may be different, and can be formed by, e.g, depositing first WFM for both p-VFINFET and n-VFINFET first, followed by a lithography process to block the p-VFINVET region, and remove the first WFM layer from the n-VFINFET, followed by resist strip, and followed by second WFM deposition over both n-VFINFET and p-VFINFET. Thus, the WFM layer 74 for n and p-VFINFET could be different materials which also may have different thickness. Then, as depicted in FIGS. 14A and 14B, a gate metal 78, for example tungsten or any other suitable metal typically used in a replacement metal gate (RMG) process, may be deposited on and surrounding the WFM layer 74 using ALD or other deposition techniques.

Figure 15A:
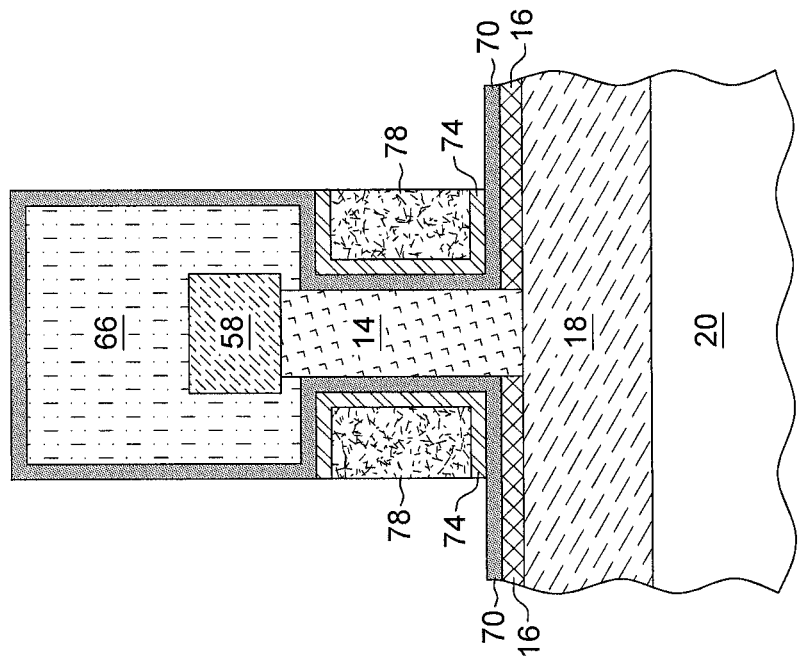
FIG. 15A depicts a cross sectional view of the structure of FIG. 14A after removal of the gate metal except for the portions located under the top spacer and above the bottom spacer.
Figure 15B:
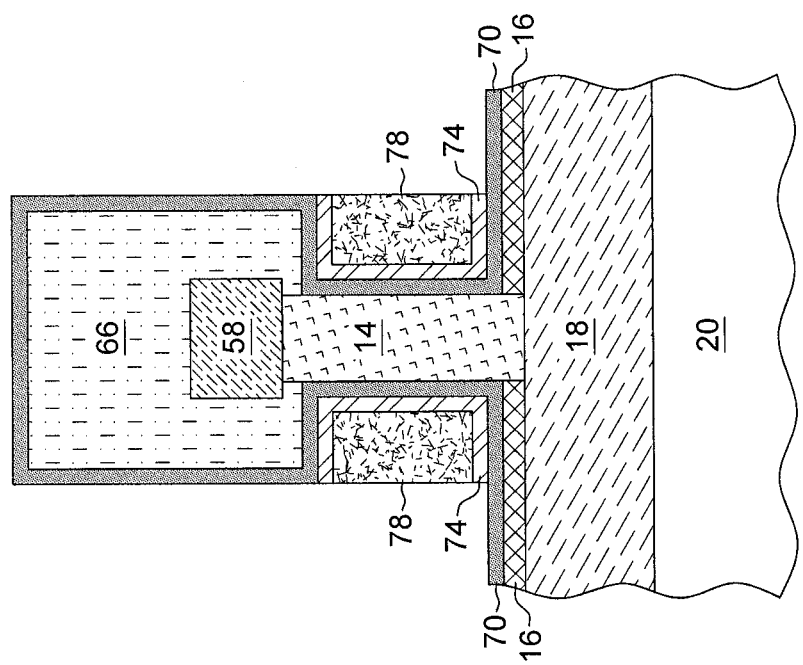
FIG. 15B depicts a cross sectional view of the structure of FIG. 14B after removal of the gate metal except for the portions located under the top spacer and above the bottom spacer.
Figure 16B:
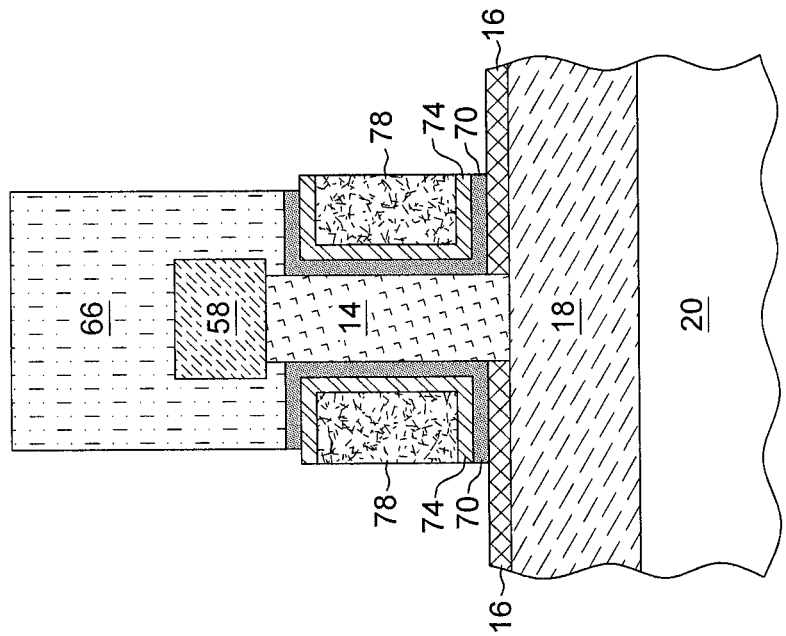
FIG. 16B depicts a cross sectional view of the structure of FIG. 15B after the high K dielectric layer is removed except for the portions located under the top spacer and above the bottom spacer.
Figure 16A:
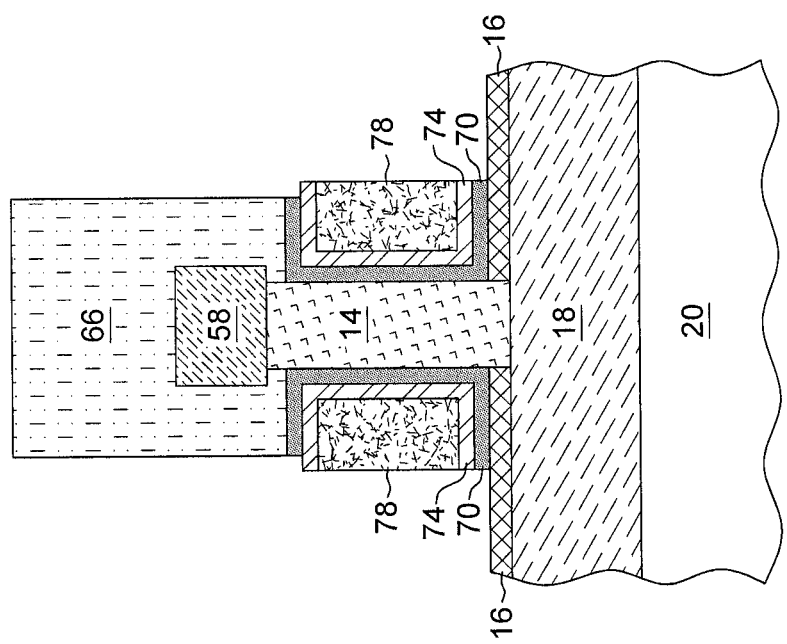
FIG. 16A depicts a cross sectional view of the structure of FIG. 15A after the high K dielectric layer is removed except for the portions located under the top spacer and above the bottom spacer.

Referring to FIGS. 15A and 15B, the gate metal 78 and WFM layer 74 may be selectively removed from the sides of the structure, but remaining between the upper source/drain junction 58 and adjacent the fin 14 and in the recess between spacer 66. In some embodiments, the selective removal includes RIE, wherein the high K dielectric 70 layer, in some embodiments hafnium oxide ($HfO_2$), acts like a mask and protects the rest of the structure, essentially a gate that has been formed self-aligned to the top S/D region to the VFINFET device, from erosion. Finally, as shown in FIGS. 16A and 16B, the exposed portions of the high K dielectric layer 70 are then removed, leaving only a lining in the recesses adjacent the fins 14, forming a self-aligned RMG gate in device 10 for both the n-VINFET side (FIG. 16A) and the p-VFINFET side (FIG. 16B).

Following these steps, device 10 may be further processed following a known set of steps for conventional VFINFET device flow to form a connecting wire to bottom S/D, gate, and top S/D, followed by a back-end-of build.

Thus, as described above, methods according to certain embodiments allow for an RMG gate that has been self-aligned to a vertical fin using the above patterning techniques. The whole high-k/metal gate formation is after bottom and top S/D formation, thus, the high-k and WFM won't see any thermal impact due to the thermal budget during S/D formation. Also, due to the unique shape of the structure, different metal gate 78 materials can be used to vary the threshold voltage (Vt) without concern for how to recess the different metals in order to define the gate length, since the unique shape of the high K dielectric layer 70 allows for self-patterning. Additionally, in recessing the gate, this also allows for protection from any plasma damage to the gate during the recessing.

What is claimed is:
1. A method comprising:
providing a fin structure comprising a fin with sacrificial material above and adjacent the fin, the fin structure being above a substrate adjacent a source or drain;
removing a first portion of the sacrificial material above the fin to form an opening within the sacrificial material on top of the fin;
forming a top source or drain within the opening on top of the fin;
removing a second portion of the sacrificial material adjacent the top source or drain;

depositing a spacer above and adjacent the top source or drain;

removing the remaining sacrificial material;

depositing a gate material above the spacer and below the spacer to the sides of the fin; and removing the gate material above the bottom portion of the spacer to form a self aligned gate around the fin and a vertical field effect transistor.

2. The method of claim 1, wherein the sacrificial material comprises a first sacrificial material.

3. The method of claim 2, wherein a top portion of the first sacrificial material located above and adjacent said fin structure is removed to allow a remaining portion of the first sacrificial material to remain adjacent said fin.

4. The method of claim 3, wherein a second sacrificial material is deposited above the remaining first sacrificial material wherein the sacrificial material comprises a first sacrificial material, the second sacrificial material, and a hard mask on the top of said fin.

5. The method of claim 4, wherein the first sacrificial material comprises a thin oxide surrounding said fin structure and an amorphous silicon deposited on top of said thin oxide.

6. The method of claim 5, wherein the second sacrificial material comprises an oxide.

7. The method of claim 6, wherein removing a first portion of the sacrificial material above the fin form an opening within the sacrificial material on top of the fin comprises removing the hard mask above or on top of said fin.

8. The method of claim 7, wherein a self-aligned contact (SAC) cap is deposited above the top source or drain within said oxide.

9. The method of claim 8, further comprising removing the oxide prior to the step of depositing a spacer above and adjacent the top source or drain.

10. The method of claim 9, wherein removing a third portion of the sacrificial material adjacent the fin comprises removing the amorphous silicon.

11. The method of claim 10, further comprising removing the thin oxide.

12. The method of claim 11, wherein the thin oxide comprises a silicon oxide.

13. The method of claim 12, further comprising providing a bottom spacer above said source or drain and substrate adjacent said fin.

14. The method of claim 13, further comprising depositing a high K dielectric material on said bottom spacer, said spacer and said fin to form an intermediate structure and annealing said intermediate structure.

15. The method of claim 14, further comprising depositing a work function metal as part of said gate material and a metal over said work function metal as part of said gate material.

16. The method of claim 15, wherein removing the gate material above the bottom portion of the spacer comprises removing said work function metal and said metal.

17. The method of claim 16, further comprising removing annealed high K material above said spacer above and adjacent the top source or drain;

depositing a second lithography stack over the barrier stack;

performing a second lithography to pattern the at least one via opening; and etching to form the at least one via opening.

18. The method of claim 17, wherein the method comprises providing multiple fin structures, multiple top sources or drains to form multiple vertical field effect transistors parallel spaced with at least two vertical field effect transistors spaced apart and aligned along lengths thereof and forming at least one additional gate connecting aligned on parallel spaced vertical field effect transistors.

19. A method comprising:

providing a fin structure comprising a fin with a hard mask on top of the fin, the fin structure being above a substrate adjacent a source or drain;

depositing one or more sacrificial materials above and along sides of the fin structure;

removing a top portion of the one or more sacrificial materials above a top of the fin to form an opening within the one or more sacrificial materials;

forming a top source or drain within the opening on the top of said fin;

removing a portion of the one or more sacrificial materials above and adjacent the top source or drain;

depositing a spacer above the top source or drain;

removing additional portions of the one or more sacrificial materials surrounding sides of the fin;

depositing gate material above the spacer and below the spacer to the sides of the fin; and removing the gate material above the bottom portion of the spacer to form a self aligned gate around the fin and vertical field effort transistor.

* * * * *